(12) United States Patent
Dietz et al.

(10) Patent No.: US 7,511,499 B2
(45) Date of Patent: Mar. 31, 2009

(54) MAGNETIC RESONANCE DEVICE COMPRISING A CYLINDRICAL VACUUM HOUSING CONTAINING A MAGNET TOGETHER WITH A COOLING DEVICE

(75) Inventors: Peter Dietz, Fürth (DE); Ralph Kimmlingen, Nürnberg (DE); Johann Schuster, Oberasbach (DE); Stefan Stocker, Großenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 5 days.

(21) Appl. No.: 11/649,617

(22) Filed: Jan. 4, 2007

(65) Prior Publication Data

US 2007/0159173 A1 Jul. 12, 2007

(30) Foreign Application Priority Data

Jan. 5, 2006 (DE) .................... 10 2006 000 923

(51) Int. Cl.
*G01V 3/00* (2006.01)
(52) U.S. Cl. .................................... 324/318
(58) Field of Classification Search ......... 324/300–322; 600/410–435; 335/296–306
See application file for complete search history.

(56) References Cited

U.S. PATENT DOCUMENTS

| 4,768,008 | A | * | 8/1988 | Purcell et al. ............... 335/216 |
| 5,574,372 | A | | 11/1996 | Moritz et al. |
| 6,157,276 | A | | 12/2000 | Hedeen et al. |
| 6,831,461 | B2 | | 12/2004 | Arz et al. |
| 2003/0088172 | A1 | | 5/2003 | Kuth |
| 2007/0014946 | A1 | * | 1/2007 | Huang et al. ............... 428/34.1 |

FOREIGN PATENT DOCUMENTS

| DE | 44 14 371 A1 | 7/1995 |
| DE | 102 29 491 A1 | 2/2003 |
| DE | 101 47 745 A1 | 4/2003 |

* cited by examiner

*Primary Examiner*—Dixomara Vargas

(57) ABSTRACT

Magnetic resonance device comprising a preferably essentially cylindrical vacuum housing containing a magnet together with a cooling device, said vacuum housing having an inner wall, an outer wall and two end walls, the inner wall and/or one or each end wall being fashioned as a composite component consisting of one or more components made of a non-metallic composite material and a plurality of metal components serving to provide mechanical reinforcement and having a lamellar or annular form for forming the inner wall or having the form of a segment of a circle for forming an end wall such that a reduction in eddy currents is produced.

19 Claims, 3 Drawing Sheets

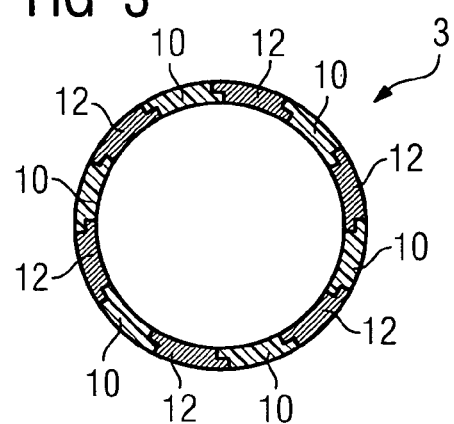
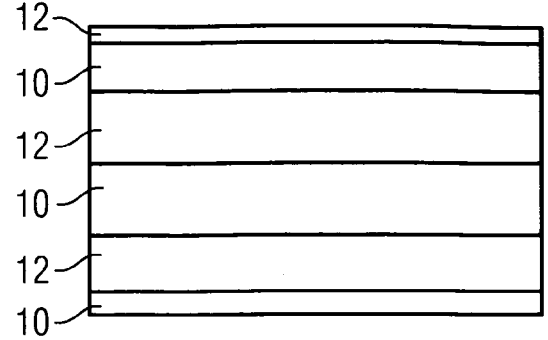
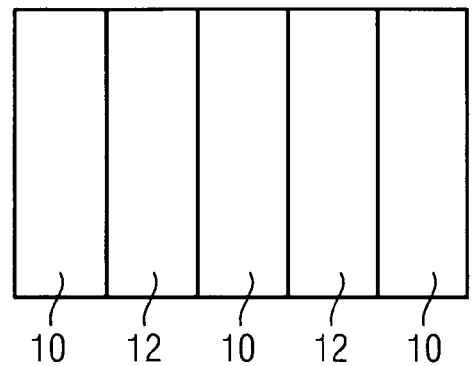
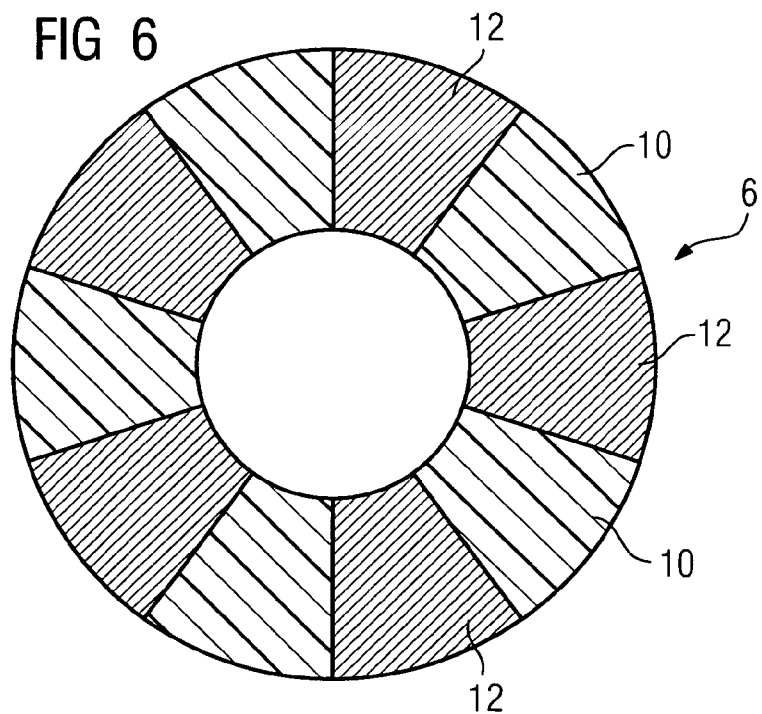

MAGNETIC RESONANCE DEVICE COMPRISING A CYLINDRICAL VACUUM HOUSING CONTAINING A MAGNET TOGETHER WITH A COOLING DEVICE

CROSS REFERENCE TO RELATED APPLICATIONS

This application claims priority of German application No. 10 2006 000 923.1 filed Jan. 5, 2006, which is incorporated by reference herein in its entirety.

FIELD OF THE INVENTION

The invention relates to a magnetic resonance device comprising a preferably essentially cylindrical vacuum housing containing a magnet together with a cooling device, said vacuum housing having an inner wall, an outer wall and two end walls.

BACKGROUND OF THE INVENTION

In known magnetic resonance devices, a magnet serves to generate a main or basic magnetic field with a strength of several T. The magnet itself consists of superconductive materials, which is why a corresponding cooling device is provided in order to be able to cool the magnet sufficiently vigorously and to maintain it in a superconductive state. The magnet together with its assigned cooling device is arranged in a vacuum housing. Normally, in known magnetic resonance devices with a central bore, a cylindrical vacuum housing, and therefore also a cylindrical magnet are provided. A gradient coil, which via corresponding alternating fields allows local coding of the magnetic resonance signals recorded, follows the vacuum housing radially inwardly. The basic structure of a magnetic resonance device is sufficiently known and does not have to be described in detail.

The gradient coil, which normally consists of a plurality of single coils, generates in addition to the actual gradient fields stray fields which lead to eddy currents in adjacent conductive structures. Lying closest to the gradient coil is, as stated, the vacuum housing or its inner wall. The vacuum housing itself is in known magnetic resonance devices formed completely from high-grade steel, therefore from a non-magnetic, but electrically conductive material. These induced eddy currents in particular in the vacuum housing have a detrimental impact on the characteristics of the system. One problem of these induced eddy currents is the noise or sound development which they give rise to. The vacuum housing, primarily its inner wall and optionally the end walls, is caused to vibrate due to the Lorentz forces generated by the changing eddy currents resulting from the high-frequency control of the gradient coils. This area, i.e. that of the vacuum housing, constitutes one of the chief sources of noise in normal magnetic resonance devices. A further problem is the negative affect on the imaging by fields induced in return by these eddy currents, which for their part act so as to generate a magnetic field, said eddy-current-induced magnetic fields also extending into the area of the gradient coil and acting detrimentally there. Stray fields resulting from these induced eddy currents can, furthermore, where they penetrate the vacuum vessel as far as the cooling device, in which liquid helium normally circulates, lead to an increase in helium boil-off. The principal cause is in each case the induced eddy currents resulting from the gradient stray fields.

From DE 102 29 491 A1 a magnetic resonance tomography apparatus is known, having damping laminated sheets for reducing vibrations, so as to reduce the transmission of noise when the tomography appliance is operating. To this end, a damping layer is provided between inner and outer sheets respectively.

In the magnetic resonance tomography apparatus having noise suppression through damping of mechanical vibrations which is described in DE 101 47 745 A1, damping elements made of a material with an electrostrictive property are provided on an inside of a magnet housing for absorbing acoustic vibrations that are produced when a gradient coil system is switched.

The magnet assembly for magnetic resonance imaging, which is known from U.S. Pat. No. 6,157,276, has an inner wall which is composed of a non-conductive material. In addition, a vapor barrier is provided that is produced by wrapping a thin ribbon of non-magnetic metal around an inner layer of the electrically insulating material of the inner wall.

DE 44 14 371 A1 describes for a diagnostic magnetic resonance apparatus a high-frequency screen between a high-frequency antenna and a gradient coil system, having a layer arrangement comprising adjacently arranged track conductors which are separated from one another by electrically insulating slots.

SUMMARY OF THE INVENTION

The object of the invention is therefore to indicate a magnetic resonance device comprising a vacuum housing which is improved with regard to the problems resulting from eddy current induction.

To achieve this object, the invention provides in a magnetic resonance device comprising a vacuum housing that the inner wall and/or one or each end wall of the vacuum housing is fashioned as a composite component consisting of one or more components made of a non-metallic composite material and a plurality of metal components serving to provide mechanical reinforcement and having a lamellar or annular form for forming the inner wall or having the form of an annular segment for forming an end wall such that a reduction in eddy currents is produced.

In the inventive magnetic resonance device., the inventive vacuum housing is no longer as previously fashioned completely from high-grade steel, rather the inventive vacuum housing is fashioned as a genuine composite component consisting of one or more components made of a non-metallic composite material, for example CFK or GFK. This composite material is a material that is not electrically conductive or only extremely weakly so or is a corresponding conglomerate of materials. On account of this, any stray fields being applied can produce no or only negligible electrical eddy currents in this composite-material component. This means that the electrical properties of this one or of these several non-metallic composite-material components are optimized in terms of the induction of minimal eddy currents. With regard to the mechanical forces which, due to the vacuum prevailing in the interior, act upon the inner wall or the respective end wall, which, as stated, form a direct wall of the vacuum housing, and with regard to the fact that the respective wall strength lies in the range of between 8 and 12 mm, according to the invention a plurality of metal components serving to provide mechanical reinforcement are combined with the non-metallic composite-material component(s) to form a composite component. Although eddy currents can be induced in these reinforcing-metal components, overall a significantly reduced eddy-current surface having interrupted or extremely lengthened eddy-current paths is produced compared with previously known high-grade-steel vacuum housings, so that ultimately the problems resulting from eddy-current induction are significantly improved compared with previously known all-metal vacuum housings. Thus, according to the invention, one or more vacuum housing walls are optimized with regard to their mechanical and electrical properties, since weakly conductive or non-conductive materials, namely one or more components made of the non-metallic composite material, are combined with non-magnetic, electrically relatively weakly conductive, metal components, preferably high-grade-steel components.

Since a substantially reduced eddy-current surface is available, a reduction in the eddy currents and the magnetic stray fields resulting from them necessarily follows. A considerable noise reduction can be achieved by this means, as the Lorentz forces exciting vibrations are also reduced. Patient comfort increases. Image quality can also be improved, since the reduced eddy currents also result in reduced stray fields, which necessarily have a lower effect on the imaging than in previously known all-metal vacuum housings. With the reduction in induced eddy currents, the helium boil-off which is ultimately gradient-induced also declines.

A first embodiment of the invention provides for the use of only one component made of non-metallic composite material, on which, spaced at a distance from one another, a plurality of planar, preferably lamellar, metal components are provided. The composite-material component is for example a tube where the cylindrical inner wall is fashioned as an inventive composite component. If an end wall is to be constructed in the inventive manner, then the composite-material component describes an annulus. The metal components are arranged on this composite-material component, which has a strength of between 8 and 12 mm, preferably in the region of approx. 10 mm, it being possible for the metal components to be arranged both on the inside and on the outside. The metal components concerned are planar, lamellar metal components which are connected as thin high-grade-steel sheets to the non-metallic composite-material component.

Where the metal components are arranged on the inside and on the outside, the metal components are usefully arranged such that two metal components arranged adjacently to one another on the inside and on the outside overlap one another. This is advantageous to the extent that the diffusion paths for helium contained in the ambient air are lengthened by this means (the helium concentration is in any case raised as a result of the continuous helium boil-off from the cooling device in the area of the magnetic resonance device). As an extremely small molecule, helium can diffuse through the non-metallic composite material, for example CFK or GFK. As a result of the overlapping arrangement of the metal components, however, the diffusion path for the helium, which cannot diffuse through the metal components, lengthens considerably.

Where the composite component to be produced is the cylindrical inner wall, then the metal components are fashioned preferably in an elongated and lamellar manner. They can in this case run in the longitudinal direction of the composite-material tube, alternatively they can also circulate radially.

They are preferably inserted and laminated in corresponding recesses provided on the composite-material component.

Where an end well is being fashioned, it is conceivable for metal components in the shape of annular segments to be used, i.e. components that become broader toward the outside. These, too can be inserted and laminated in corresponding recesses in the composite-material component.

As an alternative to using only a non-metallic composite-material component, an inventive wall component can also be constructed from a plurality of non-metallic composite-material components and a plurality of metal components which are arranged alternately. In this embodiment, the different components are equal in terms of their thickness, and preferably also in terms of their geometry. If, for example, an essentially cylindrical inner wall is to be constructed using the components and metal components, then the components are fashioned in an elongated and lamellar form and arranged parallel to the longitudinal axis of the inner wall. Alternatively, an annular embodiment of the components, which are then arranged axially in succession, is then also conceivable. In the case of the embodiment of an annular end wall, the components and the metal components are fashioned like segments and arranged radially adjacent to one another and connected to one another.

According to a first embodiment of the invention, the connection of the different component types can be carried out by means of explosive bonding. With this connecting technique, the components to be connected to one are connected to one another by means of an extremely powerful pressure wave which transforms the metal components in the area interfacing with the composite-material components into a plastic condition, at least for an extremely short period. For this purpose, the wall component to be produced, for example an internal tube, is firstly assembled from the individual components, the different individual components being arranged, for example, radially adjacent to one another. This takes place in a tube mould which counter-supports the structure. The arrangement is then closed at the front ends under water, after which a controlled explosion and thus a pressure wave is produced in the inside of this closed body, said pressure wave acting upon the composite structure and bringing about the connection of the different component types. The different, adjacently arranged components preferably overlap at the edge, meshing geometries thus being provided at the boundary which form a relatively large surface lying perpendicular to the direction of propagation of the pressure wave.

Alternatively or optionally additionally, the components and the metal components can also be bonded to one another. A further alternative or additional possibility provides for the use of mechanical connecting means, in particular of rivets or bolts, for the connection of components.

As stated, helium can—however poorly—diffuse through the non-metallic composite material. In order to counter this, a particularly appropriate embodiment of the invention provides that the component or components made of the non-metallic composite material are at least in sections vapor-plated or coated with a diffusion-proof layer, in particular a metal layer. This layer, preferably a metal layer, is only a few μm thick, which is, however, sufficient to act as a diffusion barrier. Basically, a composite-material component can be vapor-plated or coated fully or on all free surfaces with, for example, the metal layer. In view of the fact that this metal layer is extremely thin, it has a resistance, such that only very small eddy currents can be induced there or can flow there. Relative to an adjacent metal component which is substantially thicker, a high resistance gradient is produced which prevents eddy currents induced in the thicker metal components from leaking into the thin layer area. The layer, in particular the metal layer, can optionally also be locally slotted in order, in addition, to interrupt eddy-current paths in this area.

BRIEF DESCRIPTION OF THE DRAWINGS

Further advantages, features and details of the invention will emerge from the exemplary embodiments described below and from the drawings, in which:

FIG. 3 shows a sectional view through a second design of an inner wall of a vacuum housing from FIG. 1, FIG. 4 shows a side view of the inner wall from FIG. 3, FIG. 5 shows a side view of a further embodiment of an inner wall of a vacuum housing from FIG. 1, FIG. 6 shows a schematic diagram of an end wall of the vacuum housing from FIG. 1, and FIGS. 7-9 show various partial views of the area of connection of two different component types.

DETAILED DESCRIPTION OF THE INVENTION

Figure 1:
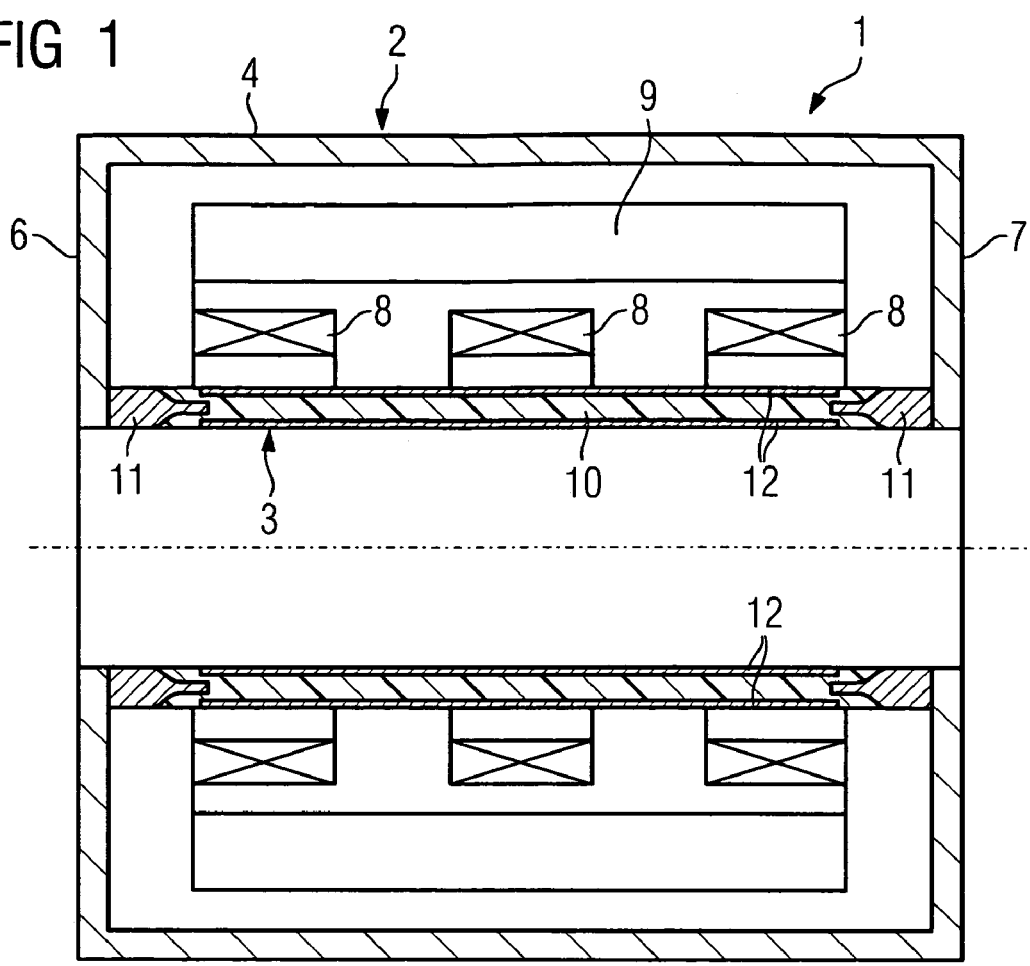
FIG. 1 shows a schematic diagram of a part of a magnetic resonance device in the area of the vacuum housing.

FIG. 1 shows in the form of a schematic diagram a part of an inventive magnetic resonance device 1, here of the vacuum housing 2, which is formed by an inner wall 3, here a cylindrical tube, an outer wall 4, also in the form of a cylindrical tube, and two end walls 6, 7, which are all connected to one another in a gastight manner. In the inside of this vacuum vessel 2 there are arranged on the one hand the magnet generating the basic and main magnetic field, shown here in the form of three separate superconductive coils 8, and a cooling device 9, in which liquid helium circulates.

In the inventive vacuum vessel 2, the cylindrical inner wall 3 is constructed in a particularly inventive manner. It consists of a cylindrical component 10 made of a non-metallic composite material, primarily CFK or GFK. On the front edges, two metal rings 11 are integrally laminated, via which rings the connection, for example a welded connection, to the adjacent end walls 6,7, which, for example, are produced as is normal from high-grade steel, can be achieved. Alternatively, an O-ring or a similar seal could be used in order to achieve a gastight connection in this transition area.

Figure 2:
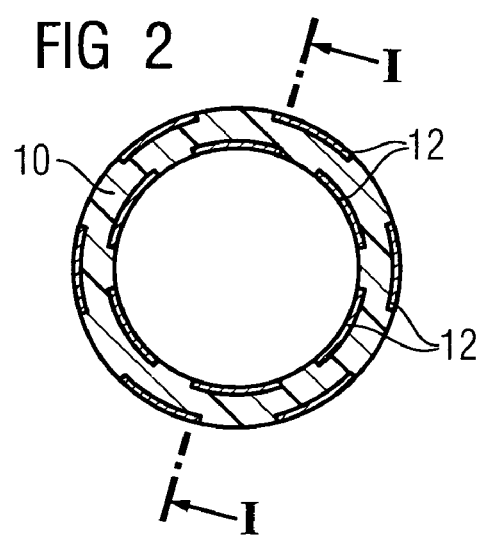
FIG. 2 shows a sectional view through the inner wall of the vacuum housing from FIG. 1.

A plurality of metal components 12 serving to provide mechanical reinforcement are arranged in a distributed manner on the non-metallic composite-material component 10 (see in particular FIG. 2). The metal components 12 are received in corresponding recesses which match in terms of their shape and geometry those of the metal components 12, and are integrally laminated there. Overall a flush inner and outer surface is produced (see FIG. 3).

As FIG. 2 clearly shows, the metal components 12 are arranged internally and externally on the composite-material component 10. They are placed and measured such that two metal components 12 lying adjacent to one another overlap, as shown in FIG. 2. By this means, the diffusion path 4 of helium contained in the air through the composite-material component 10 increases, since the helium cannot diffuse through the metal components 12. To further improve diffusion resistance, the inside of the composite-material component 10, in particular, can in the area where it is exposed, i.e. is not covered with metal components 12, be vapor-plated or coated with a diffusion-proof layer, in particular a metal layer, for example in the form of an extremely thin metal film or a coat of vapor-plated metal. As a result of the limited thickness of this metal layer, which lies in the range of a few μm, the electrical conductivity of this layer is negligible, and this layer does not therefore form an eddy-current surface and no notable eddy currents can therefore be induced in this layer. This is possible only in the metal components 12. However, these are insulated from one another (see FIG. 1) and preferably also from the metal rings 11 by means of the composite-material component 10, so that, viewed in relation to the overall surface area of the inner wall (both internally and externally), only relatively small eddy-current surfaces are produced. Even if the metal components 12 were, for example, directly adjacent to the metal rings 11, a clear improvement would nonetheless be produced compared with an inner wall made completely of high-grade steel material since even then the effective eddy-current surface would be lowered significantly and any eddy currents would have to follow substantially longer paths.

An alternative embodiment of an inner wall 3 is shown in FIG. 3. The inner wall 3 shown there consists of a plurality of non-metallic composite-material components 10 and a plurality of metal components 12 which are manifestly arranged alternately and are connected to one another. On the edges, connecting geometries are provided which mesh with one another in a form-locking manner, details of which will be given with reference to FIGS. 7-9. In the exemplary embodiment shown, the respective thickness of the components 10, 12 is the same, and their overall geometry is also the same, both in terms of length and width. They all extend parallel to the longitudinal axis of the tube and thus are arranged (see FIG. 4) with parallel axes. Such an inner wall or such an inner tube can also easily be connected using suitable fastening means or sealing means to a normal high-grade-steel end wall.

An alternative to the radial side-by-side arrangement of the different component types 10 and 12 is shown in FIG. 5. There, a plurality of non-metallic composite-material components 10 and metal components 12 are also provided, which here, however, are arranged axially in series. It should be pointed out at this point that the embodiments shown respectively in FIGS. 2-5 are only of an exemplary nature and in particular are not restricted to the geometry and number of components used in each case.

FIG. 6 shows by way of example the structure, for example, of the end wall 6 in the inventive manner. This also consists of a plurality of metal components 12 and, arranged alternately with these, a plurality of non-metallic composite-material components 10. These are fashioned here, since the end wall 6 forms an annulus, as annular segments.

Figure 7:
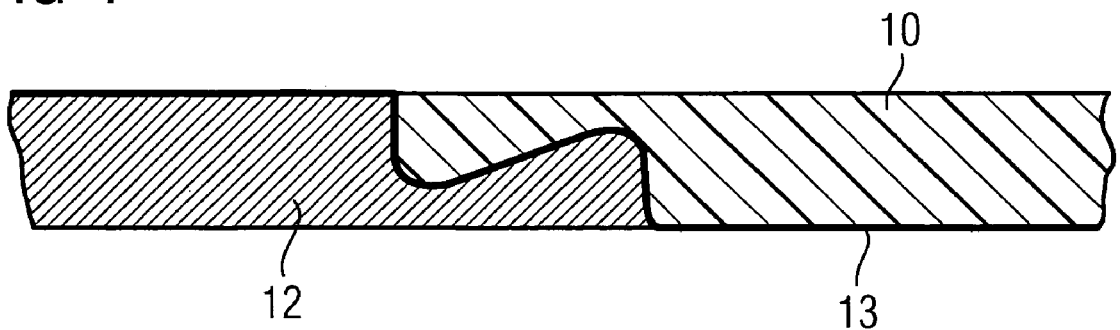
Figure 8:
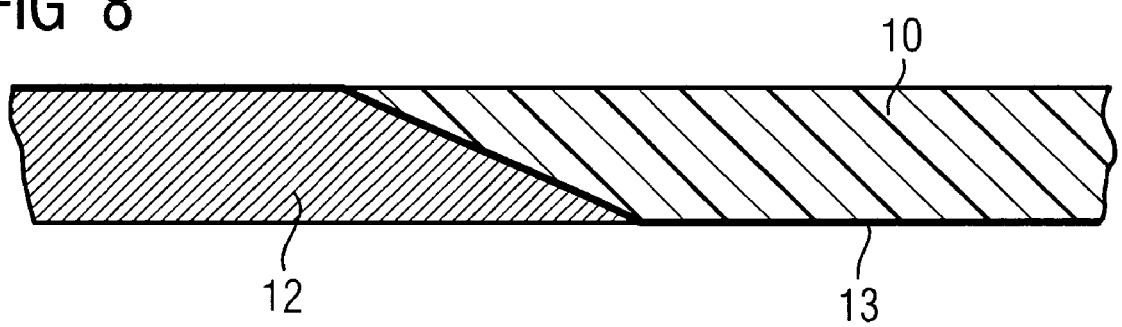
Figure 9:
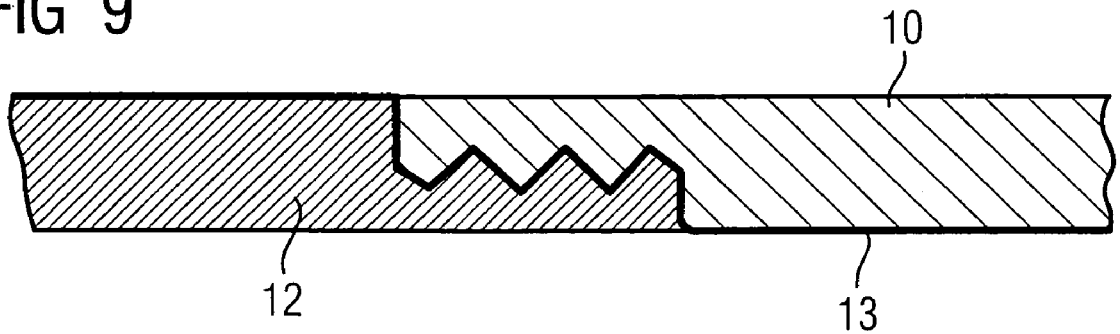

FIGS. 7-9 show different connection options, primarily for embodiments as shown in FIGS. 3, 4, 5 and 6. In each case, the area of connection of a metal component 12 to a composite-material component 10 is shown. The marginal areas of these parts exhibit geometries that are complementary to one another, i.e. they can mesh with one another in a form-locking manner and do not merely butt against one another with their vertical facing edges. A large-area contact surface between the two parts is thus produced, which is advantageous, particularly where connection is by means of explosive bonding, as a large area is provided for the pressure wave to act upon and therefore a large area of plastic deformation can be achieved in the interfacial area on the metal component 12 side. Manifestly, a diffusion-proof layer 13 is applied here on the interior of the composite-material component 10. This may be vapor-plated, but may also be a metal film. This vapor-plated or coated diffusion-proof layer 13 also extends preferably into the connection area. It serves as a diffusion barrier for helium. As shown in FIGS. 7-9, this diffusion-proof layer 13 can, particularly where a thin metal film is used, also extend over the exterior of the metal component, but this is not a necessary requirement.

While FIG. 7 shows a quasi-wavelike structure of the marginal areas, FIG. 8 shows an inclined-plane structure. Finally, FIG. 9 shows a type of saw-tooth structure in the area of the overlapping marginal sections.

Such a coating with a diffusion-proof layer 13 as shown in FIGS. 7-9 can of course be provided in each of the embodiments described, it sufficing in principle for the non-metallic composite-material component(s) to be coated on one side only.

Instead of components being connected by means of explosive bonding, it would—optionally also additionally—be conceivable for the components to be bonded to one another or, optionally also additionally, mechanically connected to one another by means of rivets or bolts.

The invention claimed is:

1. A magnetic resonance device used in a medical procedure, comprising:
   a magnet that generates a magnetic field;
   a cooling device that cools the magnet;
   an essentially cylindrical vacuum housing in which the magnet and the cooling device are arranged; and
   a composite component for constructing a wall of the essentially cylindrical vacuum housing, the composite component comprising a component of a non-metallic composite material and a plurality of metal components to reduce an eddy current,
   wherein the component of the non-metallic composite material is vapor-plated or coated with a diffusion-proof layer at least in sections.

2. The magnetic resonance device as claimed in claim 1, wherein the wall of the essentially cylindrical vacuum housing is an inner wall or an end wall.

3. The magnetic resonance device as claimed in claim 2, wherein the metal components provide a mechanical reinforcement on the constructed inner wall or the end wall.

4. The magnetic resonance device as claimed in claim 2, wherein the metal components comprise:
   a lamellar or annular shape for constructing the inner wall, or
   a segment of a circle for constructing the end wall.

5. The magnetic resonance device as claimed in claim 1, wherein the metal components are planar and are arranged on the component of the non-metallic composite material at a distance from each other.

6. The magnetic resonance device as claimed in claim 5, wherein the metal components are lamellar.

7. The magnetic resonance device as claimed in claim 5, wherein the metal components are arranged on an inside and on an outside of the component of the non-metallic composite material.

8. The magnetic resonance device as claimed in claim 7, wherein a metal component arranged on the inside of the component of the non-metallic composite material overlaps with an adjacent metal component arranged on the outside of the component of the non-metallic composite material.

9. The magnetic resonance device as claimed in claim 1, wherein the composite component comprises a plurality of components of the non-metallic composite material.

10. The magnetic resonance device as claimed in claim 9, wherein the components of the non-metallic composite material are arranged alternately with the metal components.

11. The magnetic resonance device as claimed in claim 10, wherein the components of the non-metallic composite material and the metal components for constructing an inner wall of the essentially cylindrical vacuum housing are:
    an elongated and lamellar shape and arranged parallel to a longitudinal axis of the inner wall, or
    an annular shape axially in series.

12. The magnetic resonance device as claimed in claim 9, wherein the components of non-metallic composite material and the metal components for constructing an end wall of the essentially cylindrical vacuum housing are a segment shape.

13. The magnetic resonance device as claimed in claim 1, wherein the component of the non-metallic composite material and the metal components are connected to each other by explosive bonding with an extremely powerful pressure wave which transforms the metal components in an area interfacing with the components of the non-metallic composite material into a plastic condition at least for an extremely short period.

14. The magnetic resonance device as claimed in claim 1, wherein the component of the non-metallic composite material and the metal components are bonded to each other.

15. The magnetic resonance device as claimed in claim 1, wherein the component of the non-metallic composite material and the metal components are mechanically connected to each other.

16. The magnetic resonance device as claimed in claim 15, wherein the component or the components of the non-metallic composite material and the metal components are mechanically connected to each other by rivets or bolts.

17. The magnetic resonance device as claimed in claim 1, wherein the diffusion-proof layer is a metal layer.

18. The magnetic resonance device as claimed in claim 1, wherein the diffusion-proof layer is locally slotted.

19. A method for reducing an eddy current in a magnetic resonance device having an essentially cylindrical vacuum housing, comprising:
    providing a composite component comprising a component of a non-metallic composite material and a plurality of metal components; and
    constructing a wall of the essentially cylindrical vacuum housing using the composite component,
    wherein the component of the non-metallic composite material is vapor-plated or coated with a diffusion-proof layer at least in sections.

* * * * *